United States Patent [19]
Ballantine et al.

[11] Patent Number: 6,105,274
[45] Date of Patent: Aug. 22, 2000

[54] CRYOGENIC/PHASE CHANGE COOLING FOR RAPID THERMAL PROCESS SYSTEMS

[75] Inventors: Arne W. Ballantine, South Burlington; Ronald A. Warren, Essex Junction, both of Vt.

[73] Assignee: International Business Machines Corporation, Armonk, N.Y.

[21] Appl. No.: 09/271,527

[22] Filed: Mar. 18, 1999

[51] Int. Cl.[7] .................................................. F26B 7/00
[52] U.S. Cl. .......................... 34/309; 34/310; 34/340; 34/357; 34/428; 134/7; 62/50.2
[58] Field of Search ............................ 34/307, 308, 309, 34/310, 337, 340, 357, 428; 438/695, 710, 711; 62/50.2, 606; 134/7, 37

[56] References Cited

U.S. PATENT DOCUMENTS

| | | | |
|---|---|---|---|
| 4,863,558 | 9/1989 | Jucha et al. ............................ 156/643 |
| 4,949,671 | 8/1990 | Davis et al. ............................ 118/725 |
| 5,324,009 | 6/1994 | Kemp ..................................... 266/172 |
| 5,444,217 | 8/1995 | Moore et al. . | |
| 5,512,106 | 4/1996 | Tamai et al. . | |
| 5,683,518 | 11/1997 | Moore et al. . | |
| 5,710,407 | 1/1998 | Moore et al. . | |
| 5,765,578 | 6/1998 | Brandt et al. . | |
| 5,894,742 | 4/1999 | Friedt ...................................... 62/50.2 |
| 5,960,555 | 10/1999 | Deaton et al. ............................. 34/58 |

*Primary Examiner*—Stephen Gravini
*Attorney, Agent, or Firm*—Pollock, Vande Sande & Amernick

[57] ABSTRACT

A process for treating a workpiece. The workpiece is cooled by directing toward the workpiece a material that includes a gas and particles of a material that undergoes a phase change when applied to the workpiece. The gas and the particle material are non-reactive with the workpiece during the cooling.

12 Claims, 2 Drawing Sheets

CRYOGENIC/PHASE CHANGE COOLING FOR RAPID THERMAL PROCESS SYSTEMS

FIELD OF THE INVENTION

The invention relates to processes for cooling workpieces. In particular, the present invention relates to methods and apparatus for cooling substrates in the context of semiconductor device manufacturing.

BACKGROUND OF THE INVENTION

In a variety of fields, workpieces must be heated to accomplish a variety of processes. Typically, after heating the workpieces, the workpieces may be cooled. Some processes do not include heating a workpiece, rather, the workpiece may be at ambient temperatures and require cooling. To hasten the cooling of the workpieces, whether heated or not, they may be subjected to additional processes that can include contacting the workpieces with one or more solids and/or fluids.

An example of a process where a workpiece is heated for processing and cooled occurs in the field of semiconductor device manufacture. Often, semiconductor substrates, such as silicon wafers, may be subjected to heat to accomplish certain process steps. The wafers may then be cooled. Typically, the cooling is a passive process where the heat is simply transferred by convection and radiation from the substrate into the surrounding atmosphere. The cooling may also be actively assisted.

FIG. 1 illustrates relationships between heat transfer and wafer temperature. In particular, FIG. 1 illustrates a relationship between radiative heat transfer $\dot{Q}_{rad}$ and wafer temperature and a relationship between convective heat transfer $\dot{Q}_{conv}$ and wafer temperature. As illustrated in FIG. 1, convective heat transfer is constant with wafer temperature. On the other hand, radiative heat transfer decreases as temperature of the wafer decreases. This drop off in radiative heat transfer introduces problems when trying to cool wafers since cool down rates in typical systems are about 50° C. per second at about 1100° C. to about 40° C. per second at about 1000° C. but only about 15° C. at about 700° C.

SUMMARY OF THE INVENTION

The present invention addresses these and other problems by providing a process for treating a workpiece. The process includes cooling the workpiece by directing toward the workpiece a material that includes a gas and particles of a material that undergo a phase change when applied to the workpiece. The gas and the particle are non-reactive With the workpiece during the cooling.

Other aspects of the present invention provides an apparatus for treating a workpiece. The apparatus includes a treatment chamber, a workpiece support, and at least one orifice for directing at the workpiece a cooling material that includes a gas and particles of a material that undergoes a phase change when applied to the workpiece. The gas and the particle material are non-reactive with the workpiece during the cooling.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
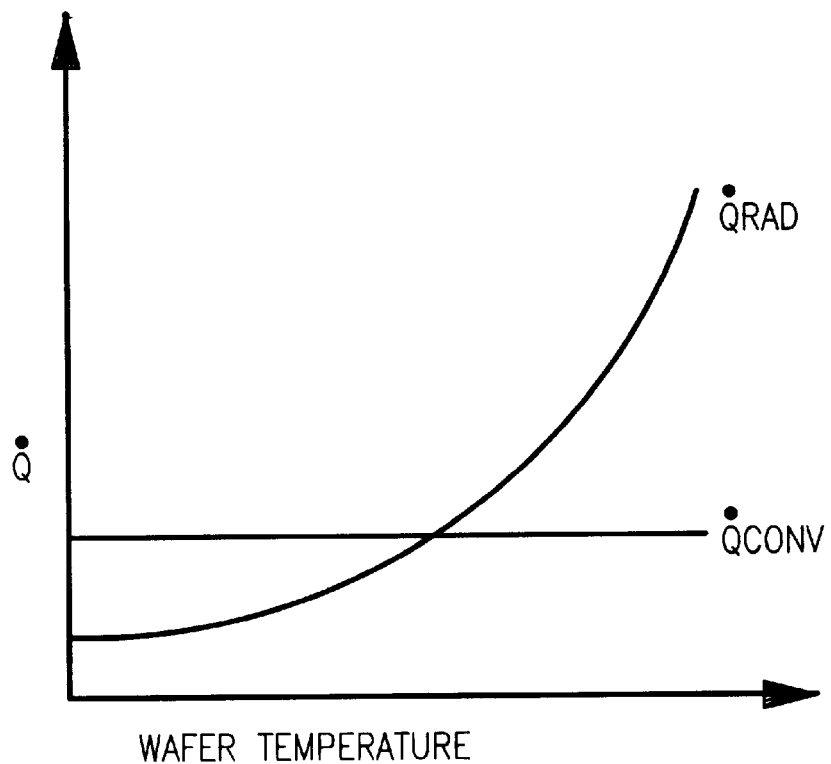
FIG. 1 represents a graph illustrating relationships between radiative heat transfer and convective heat transfer and temperature of a semiconductor wafer that is being cooled.

As stated above, during semiconductor device manufacturing, often semiconductor substrates are subjected to heating processes. An example of such processes are rapid thermal processing (RTP) techniques. Such systems typically operate under principles of radiative heating and cooling.

According to one example of an RTP, a workpiece, such as a silicon wafer, may be arranged within an RTP process chamber. A heat source is utilized to heat the space within the chamber. An example of such a heat source is an array of tungsten/halogen lamps. These lamps may be arranged above, below, and/or along the sides of the workpiece. Power is fed to these lamps at levels to raise the lamps to high temperatures. According to one example, the lamps are heated to a temperature of about 3,000 K.

According to such an RTP system, radiative heating of the workpiece occurs, transferring heat from the hot lamps to the relatively cold substrate. Heat fluxes of as high as 650 watts per cm$^2$ are possible at the beginning of a heat cycle, resulting in very high wafer temperature ramp rates. The heating may occur at a lower rate as the temperature of the wafer increases. The heat flux is related to $(T/lamp)^4-(T/wafer)^4$. Many RTP operations require high temperatures for very short times.

Whether considering RTP or other processes, desirable reactions may occur at high temperatures, while undesirable reactions may occur at lower temperatures. Because of this, in semiconductor device processing, it is typically favorable to be able to ramp the temperature as quickly as possible, let the wafer "soak" at the desired temperature, then cool the wafer as quickly as possible.

A problem encountered in such processes is that cooling processes and/or apparatuses typically utilized are inefficient and have limited cool down rates. This is because radiative and convective cooling are typically utilized. Radiative cooling heat fluxes typically rapidly decrease as the wafer temperature drops. Convective cooling typically is constant with temperature but does not provide sufficient cooling to give a high cooldown rate when typical processing gases are flowed through the chamber. A problem particularly related to RTP systems is that the lamps, even after they are no longer fed power, still radiate heat to the wafer until they are cooled to the wafer temperatures. Because the gases the wafer is exposed to while it is hot are critical, it may not be practical or possible to remove the wafer from the RTP process chamber before the wafer is partially or fully cooled.

An RTP system such as that described above typically results in cooling rates of about 50° C. per second at about 1,000° C. The cooling rate drops to about 15° C. per second at about 700° C.

The present invention was developed to increase cooling rates to minimize the time that a wafer or other substrate stays at undesirable temperatures. Although the above discussion describes a RTP processing system, the present invention may be utilized with any heating system and in any application, not just semiconductor device manufacturing. Not only may the present invention may be utilized with any heating system but with any heating and subsequent cooling process.

In fact, it is not even necessary that the present invention be utilized with a heating process. The present invention may be utilized with any process in which it is desired to cool a substrate. The substrate could be at room temperatures and then cooled according to a process of the present invention.

According to the present invention, to cool a workpiece, such as a semiconductor substrate, a cooling medium is directed toward the workpiece. The cooling medium includes at least one gas, at least one fluid, and/or at least one solid. Typically, the cooling medium includes at least one fluid. As is inherent in the definition of a fluid, a liquid or gas could be directed at the workpiece.

According to the present invention, the cooling medium may include a fluid and entrained particles that will undergo a phase change when heated. The particles may be fluid and/or solid material. According to this embodiment, the particles may undergo a phase change when applied to the workpiece. Both the fluid and the particles may withdraw heat from the workpiece. As can be appreciated, as the particulate material undergoes a phase change, the heat associated with the phase change may be extracted from the workpiece.

By directing the fluid and/or entrained particles toward a workpiece, such as a semiconductor wafer, the present invention may dramatically increase heat removal effectiveness. Accordingly, the present invention can provide much more control in heating and cooling processes, such as a rapid thermal processing described above.

The fluid and entrained particles may vary depending upon the embodiment. The selection of the fluid or fluid and particles may depend upon the desired amount of cooling as well as the temperature prior to cooling of the workpiece. The particles may be fluid and/or solid material. Also, the material or materials included in the fluid and/or particles may be selected to be substantially non-reactive with the workpiece before, during, and after the phase change in the conditions that the fluid and/or particles are directed at the workpiece. As a result, the materials utilized in the cooling medium may vary, depending upon the temperature, pressure, and other conditions within a process chamber or other environment that the processing is being carried out in.

Directing the cooling medium toward the workpiece may occur continuously or intermittently, before, during, and/or after heating the substrate. Alternatively, the cooling medium may only be directed toward the workpiece continuously or intermittently upon termination of the heating of the workpiece. No matter when the cooling medium is directed toward the workpiece, it may be directed toward the workpiece continuously or intermittently.

The cooling medium may be directed toward the entire workpiece, or toward only portions of the workpiece during processing. The cooling medium flow rate may be controlled to be lower on one region of the workpiece than on another region. By controlling the flow of the cooling medium, the regional temperature profile of the workpiece may be controlled while the cooling medium is flowed.

The cooling medium may include at least one fluid. Alternatively, the cooling medium may also include at least one solid. The fluid may be a gas and/or liquid. According to one example, the fluid is nitrogen. The nitrogen may be gaseous, liquid and/or solid.

The particulate material may be liquid or solid. According to one example, liquid and/or solid argon may be utilized as a particulate material. The particulate material may include at least one of water, carbon dioxide, nitrogen, and argon. As described above, no matter what material the particulate material includes, whether it is water, carbon dioxide, nitrogen, argon, or any other material or materials, the particulate material may be liquid or solid.

The cooling medium may be formulated and directed toward the workpiece such that a cools the workpiece at a rate of about 50° C. per second+X at about 1100° C. to about 40° C. per second +X at about 1000° C. to about 15° C.+X at about 700° C. per second. X represents a number between about 30° C. per second and about 200° C. per second. The value of X varies depending upon the cooling medium utilized, flow rates of the cooling medium, a pressures of the cooling medium, among other factors.

Those of ordinary skill in the art, once aware of the present disclosure would be able to determine cooling medium composition, cooling rates, and cooling media pressures as well as other parameters without undue experimentation once aware of the present disclosure. Along these lines increased flow of cooling medium typically leads to increased mass of cooling medium leading to greater heat transfer. For example, if the cooling medium includes solid particles, increased flow of cooling medium would lead to increased mass in the solid phase to change to the gas phase, thus increasing heat transfer.

According to one embodiment, directing a cooling medium to a workpiece according to the present invention may result in an increase of the cooldown rate from the standard cooldown rate of about 50° C. per second at about 1000° C., about 15° C. per second at about 700° C. by about 30° C. per second to about 200° C. per second.

As described above, the present invention may be utilized in a process in which a workpiece is first heated. The details of how the workpiece is heated may vary from application to application. The rate that the heat is introduced into the workpiece, the duration of the heating up process, a time that the workpiece is held at high temperature, and the cooling down process may all vary.

According to one embodiment, the high temperature of the workpiece reaches about 3,000 K prior to cooling. The heat may be applied to the workpiece continuously and/or intermittently. After achieving a desired temperature for desired period of time, heating of the workpiece may be terminated.

At a desired point, before, during, and/or after heating, the cooling medium of the present invention may directed toward the workpiece. The composition of the cooling medium may be such that after cooling, none of the cooling medium remains on the workpiece. According to one particular example, the cooling medium includes gaseous and/or liquid nitrogen and the particulate material includes liquid and/or solid argon.

A workpiece may be cooled from above and/or below by directing cooling medium toward the upper and/or lower surface of the workpiece. While it may not be desirable and/or feasible in all situations, cooling from both above and below can increase the rate that the workpiece cools. In some cases, the cooling rate can double.

Figure 4:
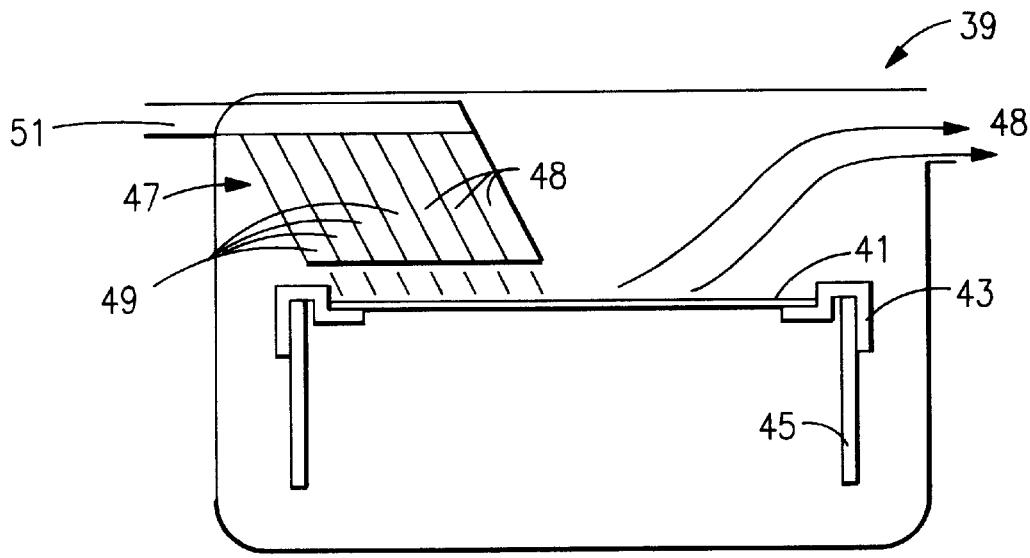
FIG. 4 represents a cross-sectional view of an embodiment of a cool down station according to the present invention.
Figure 2:
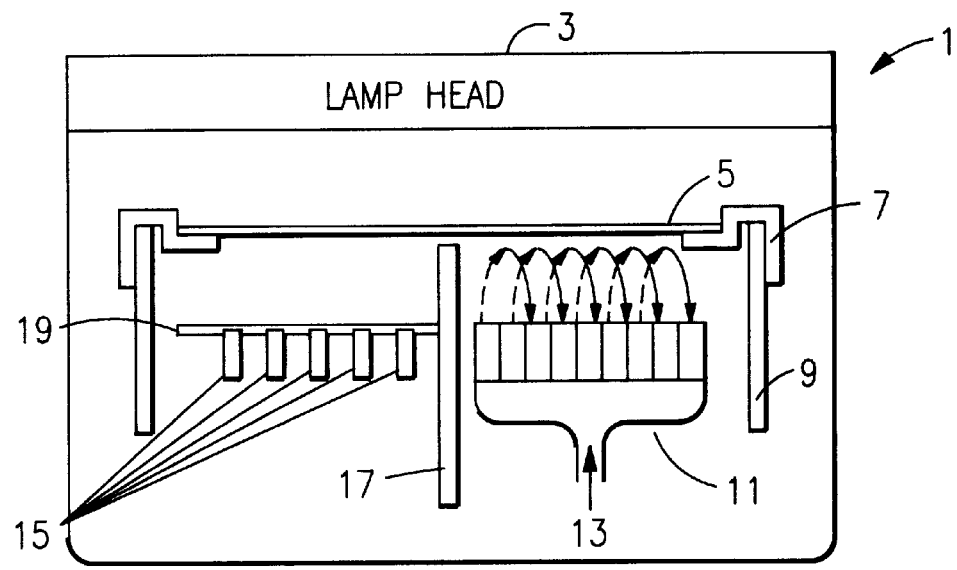
FIG. 2 represents a cross-sectional view of an embodiment of a process chamber according to the present invention.
Figure 3:
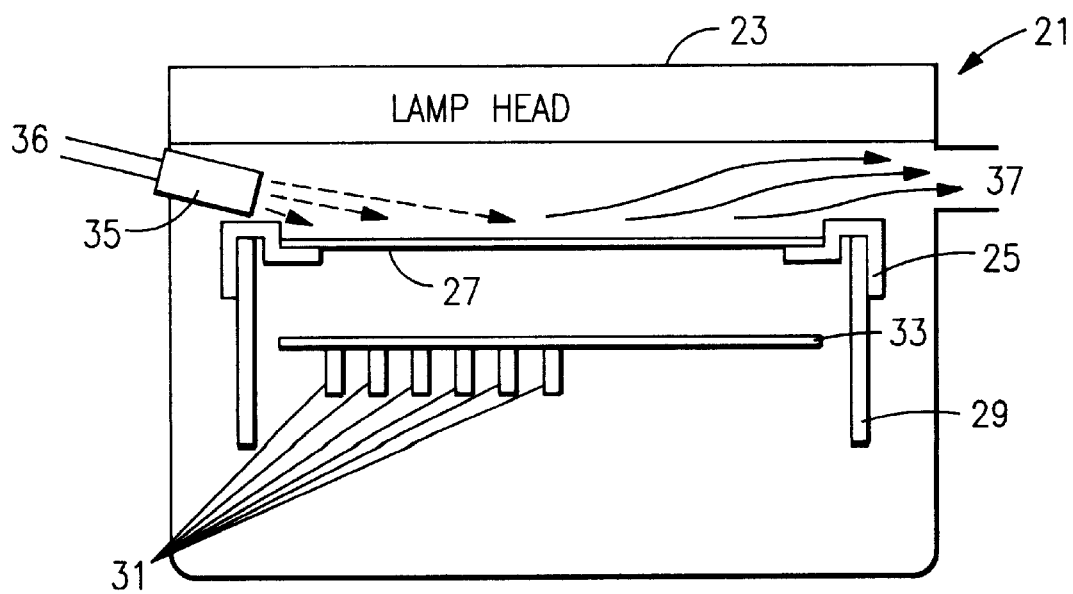
FIG. 3 represents a cross-sectional view of another embodiment of a process chamber according to the present invention.

As stated above, the present invention also includes apparatus for treating a workpiece. FIGS. 2–4 illustrate embodiments of apparatus according to the present invention. While an apparatus according to the present invention may include heating, cooling, as well as other functional elements, the apparatus may solely function to cool a workpiece.

FIG. 2 illustrates a side cross-sectional view of an apparatus according to the present invention. The apparatus illustrated in FIG. 2 includes both heating and cooling elements. Along these lines, FIG. 2 represents an apparatus that includes a processing chamber 1. The apparatus also includes a lamp head 3 that includes at least one lamp for heating the chamber 1 and the workpiece. The embodiment of the apparatus illustrated in FIG. 2 may be a rapid thermal processing (RTP) chamber.

A workpiece 5 to be treated may be arranged within the chamber 1. The workpiece may be supported in any number of ways within the chamber. For example, as shown in FIG. 2, the workpiece may be supported by a ring 7 that engages the periphery of the workpiece.

In some embodiments, to help ensure even treatment of the workpiece, the workpiece support and/or the treatment apparatus may change position. FIG. 2 illustrates one example of this. As illustrated in FIG. 2, the workpiece support 7 may be interconnected with means for rotating the workpiece. The workpiece rotating means may be any motor or other rotating device. The rotator may be interconnected with the workpiece support with any rods, gears, and/or other elements to rotate the workpiece. The embodiment represented in FIG. 2 includes connection 9 to the rotation gear, such as a motor (not shown).

The embodiment of the present invention illustrated in FIG. 2 includes elements for directing cooling medium to the opposite side of the workpiece from the side where the heating source is located. However, according to the present invention, the cooling medium and/or heat source may be arranged anywhere within a chamber for treating a workpiece.

The cooling medium may be delivered toward the workpiece through at least one cooling medium orifice. Additionally apparatus may be included to deliver the cooling medium. For example, a nozzle may be arranged in the orifice(s). The present invention may also include at least one exhaust port for helping to remove the cooling medium from the treatment chamber 1 after introduction of the cooling medium, and typically interaction with and removal of heat from the workpiece.

The embodiment illustrated in FIG. 2 includes a cooling medium nozzle and exhaust manifold 11. The nozzle and exhaust manifold 11 injects the cooling medium into the process chamber 1. In the embodiment illustrated in FIG. 2, flow from the nozzles impacts the backside of the wafer removing heat. If the cooling medium includes solid particles that undergo a phase change, heat may be removed as the solid particles are converted to gaseous phase. The nozzles and exhausts may zoned so that more or less flow may be directed to the edge or center of the wafer. Flow of the cooling medium may be controlled to obtain center to edge control of the amount of cooling provided.

As stated above, the position of the workpiece may be altered during cooling. Alternatively or additionally, the position of the nozzle and exhaust manifold may be altered during cooling of the workpiece. Accordingly, the nozzle and exhaust manifold may be connected to means for rotating it, such as a motor, as well as possibly elements for interconnecting the manifold with the rotating means.

A source of cooling medium 13 may be connected to the nozzle and exhaust manifold 11. The cooling medium source typically is arranged outside of the treatment chamber and is connected to the manifold with at least one connection. If the cooling medium includes more than one element, such as the argon and nitrogen cooling medium described above, the apparatus may include more a source of each element of the cooling medium. The elements of the cooling medium could be combined within the nozzle and exhaust manifold or outside thereof.

The present invention may also include at least one sensor for measuring temperature of the workpiece. The sensor(s) may be arranged anywhere within the treatment chamber. Also, the sensor(s) may be arranged anywhere with respect to the heating and/or cooling sources.

The embodiment of the present invention illustrated in FIG. 2 includes a plurality of sensors 15. The sensors in the embodiment shown in FIG. 2 are arranged on the same side of the workpiece 5 as the cooling medium source. The sensors in the embodiment represented in FIG. 2 are pyrometers.

In an embodiment in which the sensor(s) are arranged on the same side of a workpiece as the cooling medium source, an apparatus according to the present invention may include a divider to help isolate the sensor(s) from the cooling medium source. This may help to ensure that the sensors more accurately measure the temperature of the workpiece. The embodiment illustrated in FIG. 2 includes a divider 17.

To further enhance the accuracy of the sensor(s) in sensing the temperature of the workpiece, the present invention may include a reflector to reflect heat toward the workpiece. The reflector typically is arranged between the workpiece and the sensor(s). FIG. 2 illustrates an embodiment of a reflector 19. The pyrometers 15 illustrated in FIG. 2 are able to accurately measure temperature because of the black body cavity created by the reflector 19.

When a pyrometer is the temperature sensor, the reflector may be used, typically positioned adjacent to the pyrometer, to reflect light of the wavelength of the pyrometer. This may help to make the pyrometer temperature measurement accurate and independent of the wafer's emissivity at that wavelength.

FIG. 3 illustrates another embodiment of a process chamber according to the present invention. The embodiment illustrated in FIG. 3 is similar to the embodiment illustrated in FIG. 2. Along these lines, the embodiment illustrated in FIG. 2 includes a processing chamber 21, lamp head 23, workpiece support 25 supporting workpiece 27, workpiece position altering elements 29, sensors 31, and reflector 33.

However, the embodiment shown in FIG. 3 also includes a few rearrangements of the elements of the embodiment illustrated in FIG. 2. For example, the embodiment illustrated in FIG. 3 includes separate cooling medium introduction and exhaust elements. Along these lines, The embodiment illustrated in FIG. 3 includes at least one cooling medium nozzle 35 for directing cooling medium toward the workpiece.

However, unlike the embodiment illustrated in FIG. 2, in embodiment shown in FIG. 3, the nozzle not only is separate from the exhaust, but the nozzle is arranged to direct cooling medium toward the same side of the workpiece that the heat source is arranged adjacent. In the embodiment illustrated in FIG. 3, the cooling medium exhaust nozzle(s) is arranged at the periphery of the chamber 21.

The cooling medium source 36 is connected to the cooling medium nozzle 35.

As stated above, unlike the embodiment illustrated in FIG. 2, the embodiment shown in FIG. 3 includes an exhaust 37 that is separated from the cooling medium introduction orifice/nozzle. In the embodiment illustrated in FIG. 3, the exhaust 37 is arranged opposite the cooling medium nozzle 35. This arrangement may result in the most efficient flow through the chamber. The apparatus may include any number and arrangement of exhaust ports 37 and cooling medium introduction ports/nozzles.

While the embodiment illustrated in FIG. 3 includes a plurality of pyrometers 31 and a reflector 33, the reflector extends along the bottom side of the workpiece 27 a greater distance as compared to the embodiment shown in FIG. 2. Also, it is not necessary that the pyrometers be arranged as shown in FIG. 3, they could be situated anywhere with respect to each other and with respect to the workpiece, rather than being arranged on one side of the workpiece and equally spaced.

Unlike the embodiments of the present invention illustrated in FIGS. 2 and 3, FIG. 4 illustrates an embodiment of a chamber in which heating of the workpiece does not take place. Most RTP tools today use a cooldown chamber to improve throughput. In a cooling chamber, the workpiece, such as a semiconductor-wafer, may be cooled to about 700° C. to about 600° C. The workpiece may first be heated in the RTP chamber. Subsequently, the workpiece is moved to a cooldown chamber, where the slower cooldown rate of 15° C. per second or below does not consume processing time of the more expensive RTP chamber.

To improve the efficiency of the cooldown chamber, the present invention may be implemented there as well. FIG. 4 illustrates a cooldown chamber 39. The workpiece 41 may be supported by workpiece support 43. As in the embodiments illustrated in FIGS. 2 and 3, the workpiece may be rotated. Accordingly, workpiece rotation may accomplished through a similar mechanism 45 as in the embodiments illustrated in FIGS. 2 and 3.

The workpiece may be cooled from about and/or below. The embodiment illustrated in FIG. 4 includes a cooling medium introduction manifold 47. The cooling medium introduction manifold includes a plurality of nozzles to supply cooling medium to the top of the cooling wafer. the cooling medium introduction manifold may be connected to a cooling medium source 51.

The apparatus shown in FIG. 4 may also include at least one exhaust port 49. While the at least one exhaust port may be arranged anywhere in the chamber, in the embodiment illustrated in FIG. 4, the exhaust is arranged on the top of the chamber. In the embodiment illustrated in FIG. 4 or any other embodiment, the exhaust may be passive or actively assisted by one or more fans or other sources of negative pressure.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for treating a workpiece, the process comprising:

cooling the workpiece by directing toward the workpiece a cooling material that includes a gas and particles of a material that undergoes a phase change when applied to the workpiece, the gas and the particle material being non-reactive with the workpiece during the cooling.

2. The process according to claim 1, further comprising:

heating the workpiece; and terminating the heating of the workpiece.

3. The process according to claim 2, wherein the workpiece is heated to a temperature of up to about 3000 K.

4. The process according to claim 1, wherein the particles comprise at least one of a fluid and a solid.

5. The process according to claim 1, wherein the gas is nitrogen and the particle material is liquid or solid argon.

6. The process according to claim 1, wherein the particle material is substantially non-reactive with the workpiece before, during, and after the phase change.

7. The process according to claim 1, wherein the particle material is continuously directed toward the workpiece.

8. The process according to claim 2, wherein the particle material is directed toward the workpiece upon termination of the heating of the workpiece.

9. The process according to claim 1, wherein the particle material includes at least one member selected from the group consisting of water, carbon dioxide, nitrogen, and argon.

10. The process according to claim 2, wherein the heating and cooling are carried out in a closed chamber.

11. The process according to claim 1, wherein the cooling medium cools the workpiece at a rate of about 50° C. per second+X at about 1100° C. to about 40° C. per second+X at about 1000° C. to about 15° C.+X at about 700° C. per second, wherein X represents a number between about 30° C. per second and about 200° C. per second.

12. The process according to claim 1, wherein after cooling the workpiece none of the gas or particle material remains on the workpiece.

* * * * *